(12) United States Patent
Shiu

(10) Patent No.: US 7,663,347 B2
(45) Date of Patent: Feb. 16, 2010

(54) EFFICIENCY IMPROVING DEVICE FOR A GASOLINE ENGINE

(76) Inventor: Wu-Lie Shiu, No. 99-4, Duzihtou, Dutou Village, Guantian Shiang, Tainan County (TW)

( * ) Notice: Subject to any disclaimer, the term of this patent is extended or adjusted under 35 U.S.C. 154(b) by 603 days.

(21) Appl. No.: 11/407,218

(22) Filed: Apr. 20, 2006

(65) Prior Publication Data

US 2007/0245715 A1     Oct. 25, 2007

(51) Int. Cl.
*H02J 7/00* (2006.01)
(52) U.S. Cl. .................................. 320/166; 320/167
(58) Field of Classification Search .............. 307/30, 307/19, 20, 24; 123/633, 620, 650, 596; 320/104, 105, 109, 166, 167
See application file for complete search history.

(56) References Cited

U.S. PATENT DOCUMENTS 2,763,826 A * 9/1956 Friedman .................... 307/150
3,231,701 A * 1/1966 Craig ......................... 337/246
3,705,342 A * 12/1972 Dalke ........................... 307/30
3,805,143 A * 4/1974 Tauern et al. ............... 307/110
5,119,010 A * 6/1992 Shirata et al. .............. 320/166

* cited by examiner

*Primary Examiner*—Bao Q Vu
*Assistant Examiner*—Jue Zhang
(74) *Attorney, Agent, or Firm*—Rosenberg, Klein & Lee

(57) ABSTRACT

An efficiency improving device includes a phase compensating circuit, a filter circuit, a first diode in a forward direction, and a second diode in a reverse direction; the phase compensating circuit includes two wires, and several parallel capacitors connected to the wires; the wires are connected to the battery of a car; the filter circuit includes a resistor, and capacitors connected in series with the resistor, and it is connected the phase compensating circuit; the first and the second diodes, and the resistor of the filter circuit are connected in parallel; the filter circuit is used for filtering off impure signals produced by the circuits of the car, thus improving performance of electronic equipments and sensitivity of the acceleration pedal and the automatic gearshift; the first and the second diodes are used to control charging and discharging of the capacitors, thus preventing the capacitors from making instantaneous and massive discharge.

1 Claim, 1 Drawing Sheet

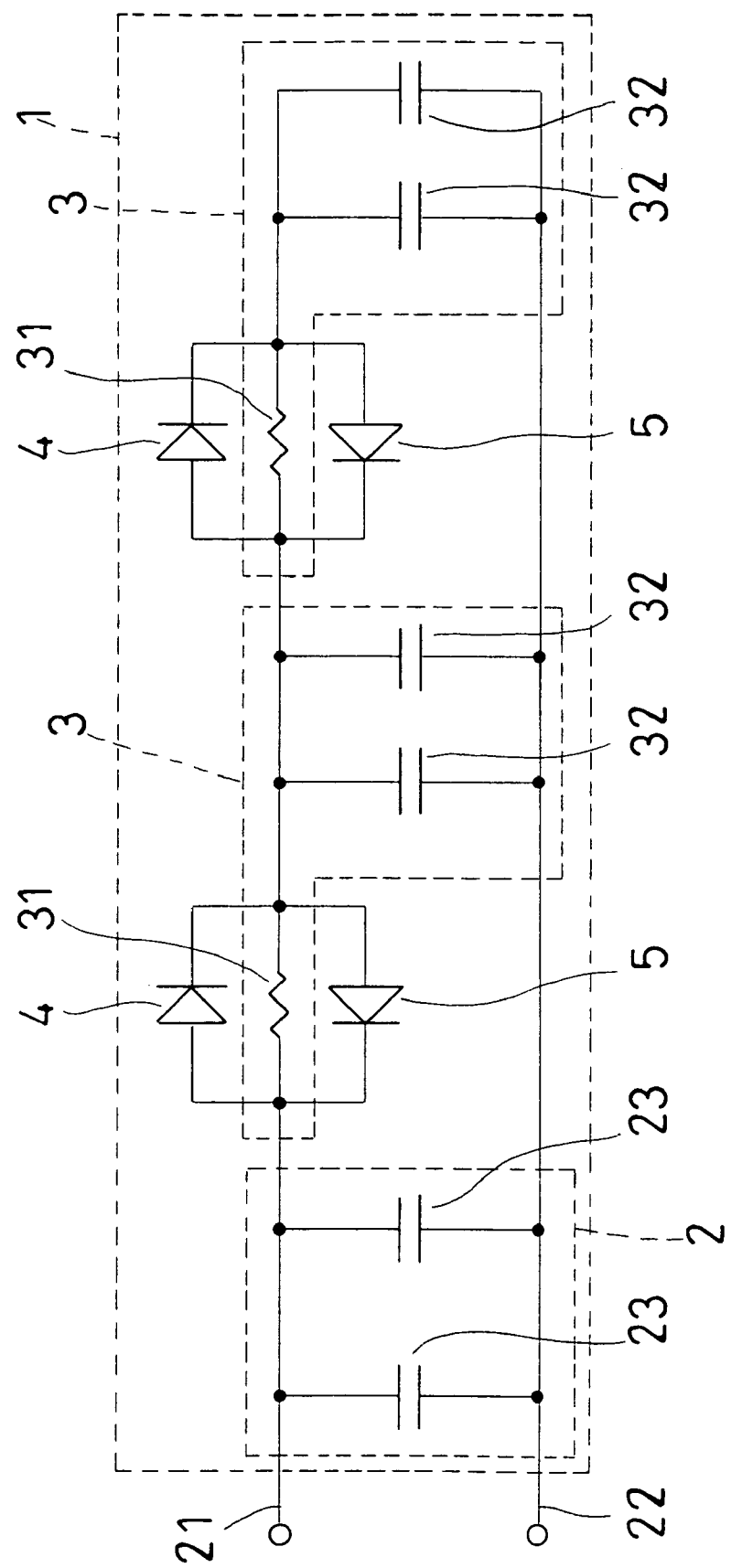

EFFICIENCY IMPROVING DEVICE FOR A GASOLINE ENGINE

BACKGROUND OF THE INVENTION

1. Field of the Invention

The present invention relates to an efficiency improving device for a gasoline engine, more particularly one, which can synchronize voltage and current, improve efficiency of the high-voltage ignition coils, the spark plugs, and the gasoline injection electromagnetic valves, eliminate impure signals, make various electronic equipments of the car function more accurately, timbre of the stereo clearer and purer, and improve sensitivity of the acceleration pedal and the automatic gearshift.

2. Brief Description of the Prior Art

Reverse-current devices are available for use in cars, which include a board-shaped part, two wires connected to the board-shaped part, and several capacitors on the board-shaped part, and are connected to car batteries. Electricity will be stored in the capacitors under normal conditions, and electricity will be supplied back to the car batteries from the capacitors if the load is too big and the batteries perform less desirably in power supplying and voltage stabilization owing to dynamic change of the cars such as accelerating, moving uphill, use of air conditioning systems and audio equipments; thus, the electric currents are stabilized, efficiency of the engines increased, and gasoline is saved.

However, such reverse-current devices are found to have the following disadvantages:

1. Precision of various electronic equipments of the cars will reduce, and acceleration pedals and automatic gearshifts of the cars become less sensitive owing to impure signals produced by electric current. Consequently, the timbre of the sound of the audio equipments is spoiled.

2. The starting motors and the engines of the cars will be subjected to massive and instantaneous electric current if all electricity stored in the capacitors is supplied back to the batteries. Consequently, performance of the starting motors and the engines is badly affected.

SUMMARY OF THE INVENTION

It is a main object of the present invention to provide an efficiency improving device for a gasoline engine to overcome the above problems.

The efficiency improving device of the present invention includes a phase compensating circuit, a filter circuit, a first diode positioned in a forward direction, and a second diode in a reverse direction. The phase compensating circuit includes two wires, and several parallel capacitors connected to the wires. The wires are connected to the battery of a car. The filter circuit includes a resistor, and capacitors connected in series with the resistor, and it is connected the phase compensating circuit. The first diode in a forward direction, the second diode in a reverse direction, and the resistor of the filter circuit are connected in parallel. The filter circuit is used for filtering off impure signals produced by the circuits of the car, thus making electronic equipments function more accurately, timbre of the stereo clearer and purer, and improving sensitivity of the acceleration pedal and the automatic gearshift. The first and the second diodes are used to control charging and discharging of the capacitors, thus preventing the capacitors from making instantaneous and massive discharge to produce massive electric current, which will affect operation of the starting motor and the engine badly.

BRIEF DESCRIPTION OF THE DRAWINGS

The present invention will be better understood by referring to the accompanying drawings, wherein:

The FIGURE is a circuit diagram of the present invention.

DETAILED DESCRIPTION OF THE PREFERRED EMBODIMENTS

Referring to the FIGURE, a preferred embodiment 1 of an efficiency improving device for a gasoline engine includes a phase compensating circuit 2, a filter circuit 3, a first diode 4 positioned in a forward direction, and a second diode 5 positioned in a reverse direction.

The phase compensating circuit 2 includes two wires 21, 22, and several parallel capacitors 23 connected to the wires 21 and 22. The phase compensating circuit 2 is connected to the filter circuit 3, which includes a resistor 31, and several capacitors 32 connected in series with the resistor 31. The first diode 4 in the forward direction, the second diode 5 in the reverse direction, and the resistor 31 of the filter circuit 3 are connected in parallel.

The efficiency improving device 1 is connected to a car battery at the wires 21 and 22 of the phase compensating circuit 2 thereof; thus, the filter circuit 3, which consists of the resistor 31 and the capacitors 32, will filter off various kinds of impure signals when the battery is being used. And, the first diode 4 positioned in the forward direction, and the second diode 5 positioned in the reverse direction are used to control charging and discharging of the capacitors 32, and protect the resistor 31 for making the starting motor and the engine of the car function more smoothly and efficiently; electric current will flow into and charge the capacitors 32 of the filter circuit 3 through the first diode 4 positioned in the forward direction if input voltage is larger than the forward bias of the first diode 4 owing to dynamic change of the car. Electricity in the capacitors 32 will flow into the capacitors 23 through the second diode 5 positioned in the reverse direction if voltage difference between the capacitors 23 and the capacitors 32 is larger than the forward bias of the second diode 5.

Furthermore, the phase compensating circuit 2 of the efficiency improving device 1 can be connected with many sets of filter circuits 3 and diodes in both forward and reverse directions for meeting different needs; thus, the car will function more stably.

From the above description, it can be seen that the present invention has the following advantages over the prior art:

1. The efficiency improving device has the filter circuit connected to the phase compensating circuit for filtering off impure signals produced by the circuits of a car, thus making various electronic equipments of the car function more accurately, timbre of the stereo clearer and purer, and improving sensitivity of the acceleration pedal and the automatic gearshift.

2. Charging and discharging of the capacitors of the efficiency improving device are controlled with the diodes respectively positioned in the forward and the reverse directions such that the capacitors are prevented from making instantaneous and massive discharge to produce massive electric current, which will affect the operation of the starting motor and the engine badly.

What is claimed is:

1. An efficiency improving device for a gasoline engine, comprising:

a phase compensating circuit, said phase compensating circuit including two wires respectively defining first and second battery terminals, and a plurality of parallel capacitors connected to said wires;

a filter circuit connected to said phase compensating circuit to extend between said wires, said filter circuit including a resistor, and a capacitor set connected in series with said resistor; and a first diode in a forward direction, and a second diode in a reverse direction, said first and second diodes and said resistor of said filter circuit being connected in parallel.

* * * * *